United States Patent [19]
Knowles

[11] Patent Number: 5,828,064
[45] Date of Patent: Oct. 27, 1998

[54] FIELD EMISSION ENVIRONMENTAL SCANNING ELECTRON MICROSCOPE

[75] Inventor: W. Ralph Knowles, North Andover, Mass.

[73] Assignee: Philips Electronics North America Corporation, New York, N.Y.

[21] Appl. No.: 693,616

[22] Filed: Aug. 7, 1996

Related U.S. Application Data

[60] Provisional application No. 60/002,224 Aug. 11, 1995.

[51] Int. Cl.$^6$ ...................................................... H01J 37/00
[52] U.S. Cl. ............................................................ 250/310
[58] Field of Search ................................. 250/310, 423 F

[56] References Cited

U.S. PATENT DOCUMENTS

| | | | |
|---|---|---|---|
| 4,823,006 | 4/1989 | Danilatos et al. | 250/310 |
| 4,926,055 | 5/1990 | Miyokawa | 250/423 F |
| 4,992,662 | 2/1991 | Danilatos | 250/310 |
| 5,250,808 | 10/1993 | Danilatos et al. | 250/310 |
| 5,362,964 | 11/1994 | Knowles et al. | 250/310 |
| 5,396,067 | 3/1995 | Suzuki et al. | 250/310 |
| 5,412,211 | 5/1995 | Knowles | 250/310 |
| 5,485,008 | 1/1996 | Taylor | 250/310 |

*Primary Examiner*—Bruce Anderson
*Attorney, Agent, or Firm*—Frommer Lawrence & Haug LLP

[57] ABSTRACT

An environmental scanning electron microscope with, field emission gun providing for a spatial resolution of the specimen under examination of 2nm which is comparable to the spatial resolution of high vacuum field emission scanning electron microscopes even though the specimen is contained in the gaseous environmental of the specimen chamber. The objective lens assembly of this environmental scanning electron microscope includes a differentially pumped aperture system having at least four differentially pumped vacuum zones to provide a pressure difference of up to approximately $10^{10}$ Torr between the field emission gun and the specimen. The differentially pumped aperture system further includes at least four pressure limiting apertures defining the differentially pumped vacuum zones through which the electron beam passes. One of the pressure limiting apertures is formed of a pressure limiting aperture assembly which includes a plurality of stacked annular apertures. Further, an electron detection assembly is provided for detecting signals emanating from the surface of the specimen. The electron detection assembly includes a printed circuit board having a signal ring electrode biased to collect secondary electrons emanating from the surface of the specimen and a final pressure limiting aperture integrally formed therewith which extends through the signal ring electrode so that the electron beam path through the gaseous environment of the specimen chamber is minimized.

37 Claims, 6 Drawing Sheets

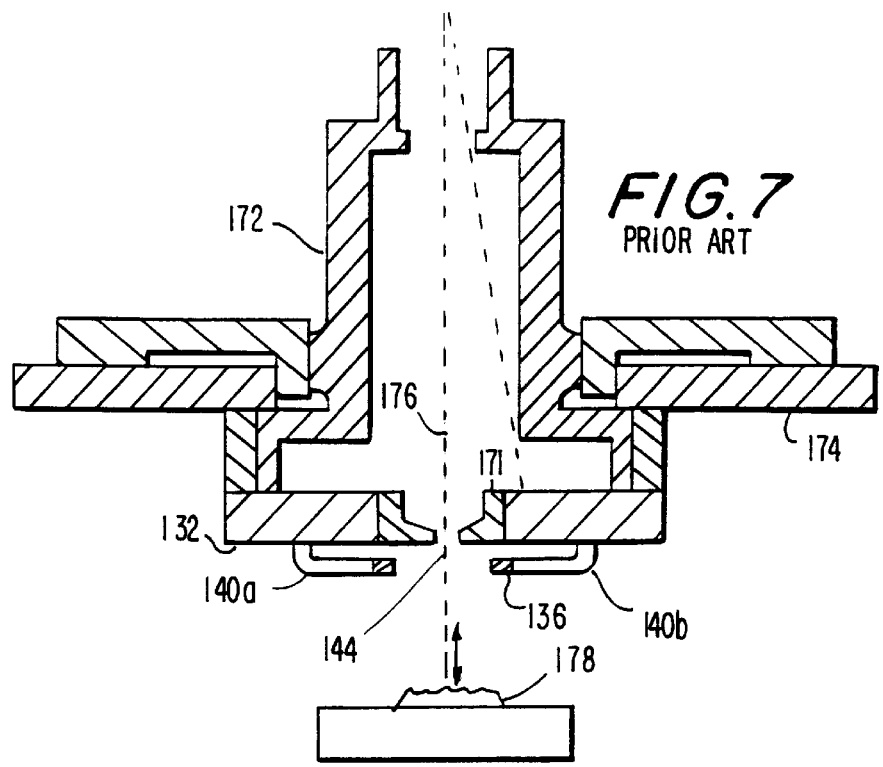
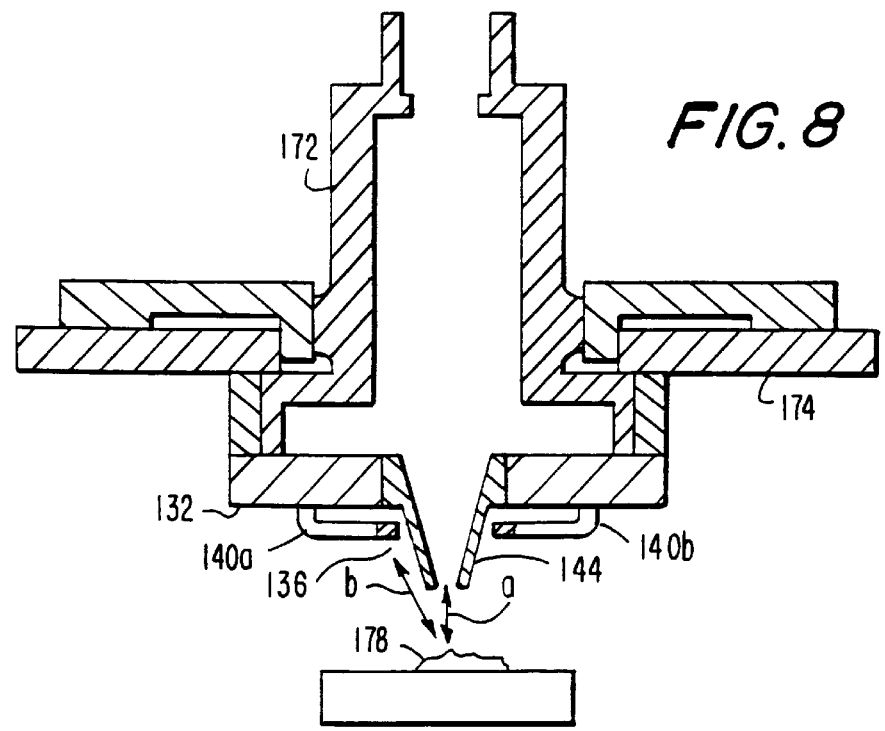

FIELD EMISSION ENVIRONMENTAL SCANNING ELECTRON MICROSCOPE

CROSS-REFERENCE TO RELATED APPLICATIONS

This application is based upon U.S. Provisional patent application Ser. No. 60/002,224, filed Aug. 11, 1995, the subject matter of which is incorporated by reference.

1. Field of the Invention

This invention relates to the field of environmental scanning electron microscopes ("ESEM"), and more particularly, to an environmental scanning electron microscope which achieves improved spatial resolution by using a field emission electron gun.

2. Background of the Invention

As background, the advantages of environmental scanning electron microscopes over standard scanning electron microscopes (SEM) lie in its ability to produce high-resolution electron images of moist or non-conductive specimens (e.g., biological materials, plastics, ceramics, fibers) which are extremely difficult to image in the usual vacuum environment of the SEM. The environmental scanning electron microscope allows the specimen to be maintained in their "natural" state without subjecting it to the distortions caused by drying, freezing, or vacuum coating normally required for high-vacuum electron beam observation. Also, the relatively high gas pressure easily tolerated in the environmental scanning electron microscope specimen chamber acts effectively to dissipate the surface charge that would normally build up on a non-conductive specimen, blocking high quality image acquisition. The environmental scanning electron microscope also permits direct, real-time observation of liquid transport, chemical reaction, solution, hydration, crystallization, and other processes occurring at relatively high vapor pressures far above those that can be permitted in the normal SEM specimen chamber.

U.S. Pat. No. 5,412,211 assigned to the common assignee of this application further describes the advantages of an environmental scanning electron microscope over the standard high vacuum scanning electron microscope, the subject matter of which is incorporated herein by reference. It also describes improvements to achieve a performance that is comparable to the standard high vacuum scanning electron microscope.

The high magnification performance of a scanning electron microscope ("SEMI") is limited by the performance of the electron gun. For the last 20 years, the best SEM performance was achieved by using a type of gun known as a field emission gun. The conventional SEM uses a gun where the electrons are emitted from a material at high temperature (e.g. a heated tungsten wire). In the field emission gun, the electrons are pulled off the surface of a finely-pointed tungsten crystal by a very strong electrostatic field. However, a field emission gun must operate at ultra high vacuum (typically greater than $10^{-9}$ Torr) which is expensive, and the sharp pointed tungsten crystal wire is also expensive. Hence field emission is typically used only in high-end scanning electron microscopes.

As aforementioned, the field emission gun requires a very high vacuum (better than $10^{-9}$ Torr) for its operation. The standard field emission scanning electron microscope also has a high vacuum in the sample chamber, but this vacuum is greater than $10^{-4}$ Torr. A number of differential vacuum zones are used to provide the $10^5$ difference in pressure between the operating pressure of the field emission gun and the pressure of the specimen chamber.

In an ESEM, the pressure in the specimen chamber is typically maintained at a pressure up to 10 Torr and hence the difference in pressure between the sample chamber and the field emission gun is $10^{10}$. Moreover, the electron beam has to travel through a gas environment and there are collisions between the electron beam and the gas which may cause a loss of spatial resolution.

In U.S. Pat. No. 5,396,067, an environmental scanning electron microscope is disclosed which is concerned with the use of low accelerated voltages, and the problems of excess positive ions. However, U.S. Pat. No. 5,396,067 does not address the problems of combining a field emission gun with the environmental scanning electron microscope at high beam voltages.

It has also not been previously demonstrated that it is possible to retain the very high spatial resolution of the field emission scanning electron microscopes in a gaseous environment. Comparable high vacuum field emission scanning electron microscopes achieve spatial resolutions of about 2nm. The best spatial resolution achieved previously in an environmental scanning electron microscope was 4nm. It is thus desirable to provide an environmental scanning electron microscope which achieves a spatial resolution of 2nm which is comparable to that of high vacuum field emission scanning electron microscopes.

OBJECTS OF THE INVENTION

Therefore, it is an object of the present invention to provide an environmental scanning electron microscope which avoids the aforementioned deficiencies of the prior art.

It is also an object of this invention to provide an environmental scanning electron microscope which achieves improved spatial resolution of approximately 2nm by using a field emission electron gun.

It is a further object of this invention to combine a field emission gun with an environmental scanning electron microscope which can be used at any voltage to high beam voltages, such as to high beam voltages of 300–500 kv.

It is another object of this invention to provide an environmental scanning electron microscope which retains the very high spatial resolution of the field emission scanning electron microscopes, but in a gaseous environment.

It is a further object of this invention to provide an environmental scanning electron microscope which combines a field emission gun with an environmental scanning electron microscope to achieve substantially the same spatial resolution of a specimen maintained in the specimen chamber at a pressure range of $10^{-2}$ Torr to 50 Torr that is achieved in high vacuum field emission scanning electron microscopes.

It is yet another object of this invention to provide an environmental scanning electron microscope wherein a field emission gun is combined with the environmental scanning electron microscope and the ultra high vacuum required for the field emission gun can be maintained even though the specimen chamber is maintained at a pressure of between $10^{-2}$ Torr and 50 Torr, and preferably 10 Torr.

It is a still further object of this invention to provide an improved pressure limiting aperture in an environmental scanning electron microscope which achieves improved spatial resolution by using a field emission electron gun.

It is yet a further object of this invention to provide an improved gaseous secondary electron detector in an environmental scanning electron microscope which achieves improved spatial resolution by using a field emission electron gun.

Various other objects, advantages and features of the present invention will become readily apparent from the ensuing detailed description and the novel features will be particularly pointed out in the appended claims.

SUMMARY OF THE INVENTION

This invention relates to an environmental scanning electron microscope which achieves improved spatial resolution by using a field emission electron gun in a gaseous environment.

In a preferred embodiment thereof, the environmental scanning electron microscope includes a field emission electron gun for generating and directing an electron beam towards a specimen to be examined. In this environmental scanning electron microscope, the electron beam passes through a differentially pumped electron optic column. In the differentially pumped electron optic column, the electron beam is passed through a series of pressure limiting apertures, as will be described in more detail below.

A specimen chamber is positioned below the objective lens assembly and is capable of maintaining the specimen enveloped in gas in registration with a final pressure limiting aperture separating the objective lens assembly and the specimen chamber such that a surface of the specimen may be exposed to the focused beam of electrons. A specimen mount is located within the specimen chamber and is positioned for supporting the specimen approximately 1 to 25 mm below the pressure limiting aperture so as to allow the focused beam of electrons to interact with the specimen. In the specimen chamber, the specimen is maintained at a pressure of between about $10^{-2}$ and 50 Torr, and preferably 10 Torr.

In accordance with one of the general objects of the present invention, this environmental scanning electron microscope achieves an improved spatial resolution of approximately 2nm comparable to the spatial resolution achieved in high vacuum scanning electron microscopes. More specifically, the present invention incorporates a field emission gun in an environmental scanning electron microscope which can be used at any voltage to high beam voltages, such as to high beam voltages of 300–500kv.

In order to provide the required pressure difference of $10^{10}$ between the field emission gun and the specimen chamber, the electron optic column includes a differentially pumped aperture system having at least four differentially pumped vacuum zones including a high pressure zone of the field emission gun which is maintained at a pressure of approximately $10^{-10}$ Torr, a first intermediate vacuum zone maintained at a pressure of approximately $10^{-7}$ Torr, a second intermediate vacuum zone maintained at a pressure of approximately $10^{-4}$ Torr, and a third intermediate vacuum zone maintained at a pressure of approximately 0.1 Torr. As aforementioned, the specimen chamber is preferably maintained at a pressure of approximately 10 Torr.

In this environmental scanning electron microscope, the path of the electron beam generated by the field emission gun passes through four or more pressure limiting apertures which separate the ESEM into the five differentially pumped vacuum zones. Specifically, an upper pressure limiting aperture is provided between the high vacuum zone and the first intermediate vacuum zone. A first intermediate pressure limiting aperture is provided between the first and second intermediate vacuum zones. A second intermediate pressure limiting aperture is provided between the second and third intermediate vacuum zones. Lastly, the final pressure aperture separates the third intermediate vacuum zone of the objective lens assembly from the specimen chamber.

In order to collect gas that flows through the pressure limiting apertures, each vacuum zone of the objective lens assembly has a vacuum pump. In accordance therewith, the high pressure zone and the first intermediate vacuum zone each communicate with an ion pump, the second intermediate vacuum zone communicates with a diffusion pump, and the third intermediate vacuum zone communicates with a rotary pump.

In accordance with another object of the present invention, an improved pressure limiting aperture is incorporated in this environmental scanning electron microscope which achieves improved spatial resolution by using a field emission electron gun. This pressure limiting aperture has been designed to be free of contamination which would affect the beam, to be easy to clean, and to provide the required gas flow restriction. More particularly, in this ESEM, the second intermediate pressure limiting aperture of the differentially pumped aperture system includes a pressure limiting aperture assembly having an aperture holder which is sealed to an annular vacuum wall which separates the second and third intermediate vacuum zones. This pressure limiting aperture assembly includes a plurality of stacked annular platinum apertures which are fitted into the aperture holder which extends upwardly from the annular vacuum wall. The platinum apertures extend inwardly from the aperture holder so that the only gas path is through the aligned central openings provided in the platinum apertures. An annular retaining ring is positioned inwardly from the top portion of the aperture holder which thereby compresses the platinum apertures tightly together between the retaining ring and the annular vacuum wall.

As in the environmental scanning electron microscope of U.S. Pat. No. 5,412,211, this environmental scanning electron microscope includes an electron detector configuration which reduces the backscattered electron component of the signal emanating from the surface of the sample and reduces the signal noise produced by the primary electron beam. More specifically, this configuration includes a biased pressure limiting aperture electrode detector formed integrally with the final pressure limiting aperture and a biased ring electrode provided within the specimen chamber above the surface of the specimen. In order to provide mechanical rigidity for the electrodes collecting signals emanating form the surface of the specimen under examination, the electron detector assembly is in the form of a printed circuit board. The printed circuit board includes a detector head having collection electrodes thereon for collecting signals emanating from the specimen. In one embodiment, these collection electrodes include a signal ring electrode biased to collect secondary electrons emanating from the surface of the specimen and a biased electrode pad to reduce signals emanating from the backscattered and low angle reflected electrons.

The object of the improved gaseous electron detector of the ESEM of the present invention which incorporates a field emission gun is to allow a short gas path to the sample, but maintain a relatively long gas path to the signal ring electrode detector. In order to achieve this result, the final pressure limiting aperture formed integrally with the printed circuit board extends annularly inwardly in an inverted conical arrangement through the signal ring electrode. This configuration reduces the length of the path of the electron beam through the gaseous environment of the specimen chamber.

For better imaging capabilities, in this ESEM, the signal ring electrode and the final pressure limiting aperture are biased at different electrical potentials. To that end, the signal ring electrode is biased at a voltage V1 necessary for satisfactory detection, usually about +500 volts. In order to insure that the electron signal generated in the gaseous environment of the specimen chamber is not collected by the final pressure limiting aperture, but is deflected to the signal electrode ring, the final pressure limiting aperture is biased at a voltage V2 which is about 5 to 100 volts less than the bias voltage V1 of the signal ring electrode.

In addition, the printed circuit board herein includes a guard ring which is positioned outwardly of the signal ring electrode and is biased at a voltage V3 such that the guard ring collects the secondary electrons produces by backscattered electrons which strike the objective lens assembly. This guard ring is typically biased at approximately the same voltage as the signal ring electrode (i.e., V3 =V1).

BRIEF DESCRIPTION OF THE DRAWINGS

The following detailed description, given by way of example, but not intended to limit the invention solely to the specific embodiments described, may best be understood in conjunction with the accompanying drawings in which:

FIG. 7 is an enlarged schematic representation of a portion of the environmental scanning electron microscope disclosed in U.S. Pat. No. 5,412,211 specifically illustrating the sealing between the body detector and an electrode detector assembly;

FIG. 8 is a schematic representation of an improved gaseous electron detector assembly to be used in conjunction with the environmental scanning electron microscope of the present invention illustrated in FIG. 6.

DETAILED DESCRIPTION OF CERTAIN PREFERRED EMBODIMENTS

Figure 1:
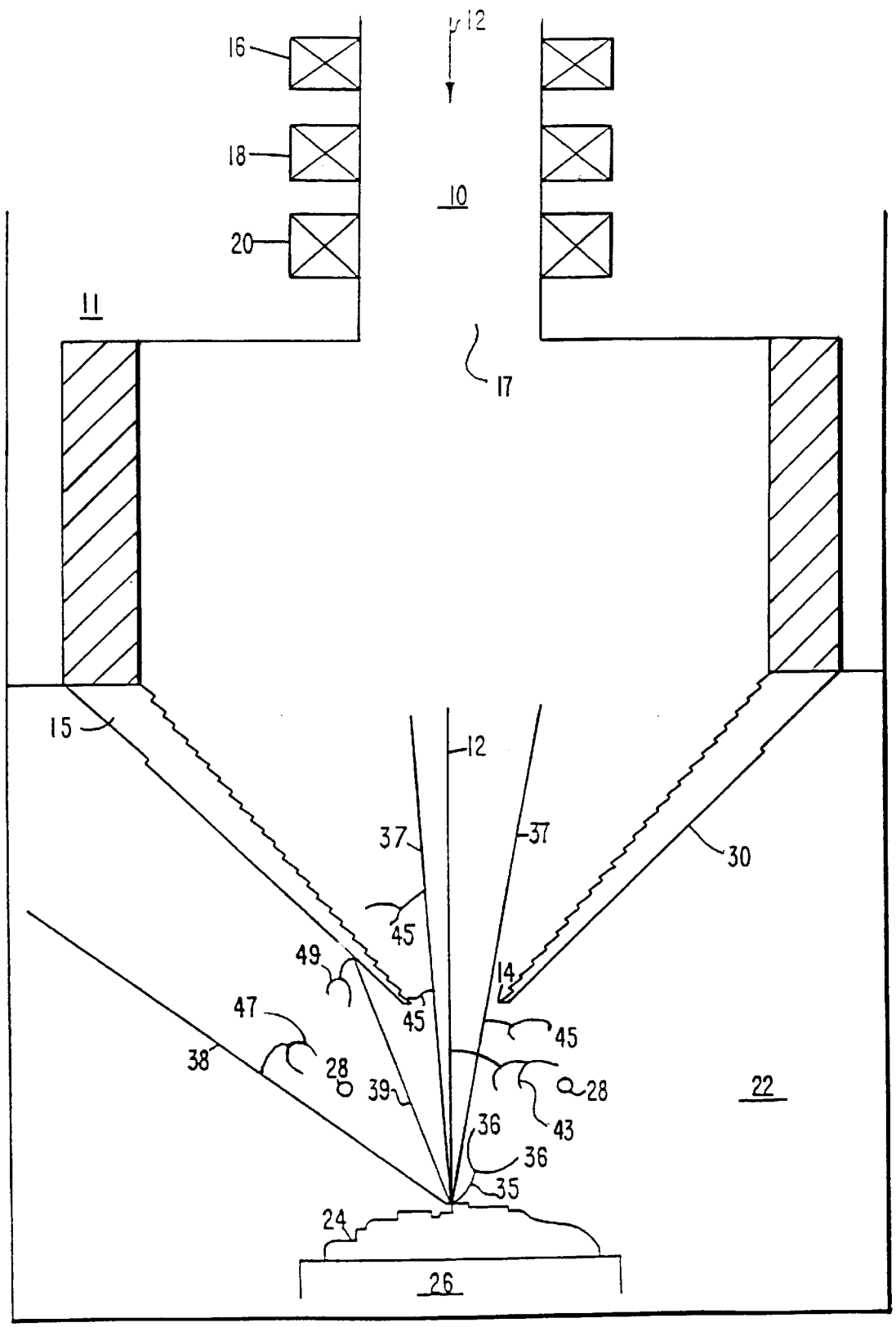
FIG. 1 is a schematic representation of an example of electron trajectory paths in an environmental scanning electron microscope.

Referring now to FIG. 1, the prior environmental scanning electron microscope of U.S. Pat. Nos. 5,362,964 and 5,412,211 is illustrated, the subject matter of which are incorporated herein by reference. In this environmental scanning electron microscope, a device for generating, amplifying and detecting secondary and backscattered electrons emanating from a surface of a sample being examined is provided. More specifically, a beam of electrons 12 is emitted through an electron optical column 10, and objective lens 11 by a conventional electron gun (not shown). The vacuum optical column 10 includes a final pressure limiting aperture 14 at its lower end thereof. The final pressure limiting aperture 14 is formed within the lower end of an aperture carrier 15. This aperture carrier 15 is discussed in U.S. Pat. No. 4,823,006, the subject matter of which is incorporated by reference. This aperture carrier includes a second pressure limiting aperture 17 positioned above the final pressure limiting aperture 14 which communicates directly with the electron optical column 10. The electron beam passes through magnetic lenses 16 and 18 which are used to control the intensity of the electron beam. Focusing means 20 located within the objective lens assembly 11 adjacent to the vacuum column is capable of directing the beam of electrons through the final pressure limiting aperture 14.

In the prior ESEM construction of FIG. 1, the beam is subsequently directed into a specimen chamber 22 through final pressure limiting aperture 14 wherein it impinges upon a specimen 24 supported on a specimen stage. The specimen mount or stage 26 is located within the specimen chamber 22 and is positioned for supporting specimen 24 approximately 1 to 25mm, and preferably 1 to 10mm, below final pressure limiting aperture 14 so as to allow the beam of electrons to interact with the specimen. The specimen chamber is disposed below the optical vacuum column 10 and is capable of maintaining the sample 24 enveloped in gas, preferably nitrogen or water vapor, at a pressure of approximately between $10^{-2}$ to 50 Torr in registration with the pressure limiting aperture such that a surface of the specimen may be exposed to the charged particle beam emitted from the electron gun and directed through the pressure limiting aperture 14.

As shown in FIG. 1, a ring detector 28 was provided in the specimen chamber of the environmental scanning electron microscope of U.S. Pat. Nos. 5,362,964 and 5,412,211 between the final pressure limiting aperture 14 and the specimen 24. This ring electrode detector is disclosed as being preferably formed of a thin ring, made of metal, and has a wire thickness of approximately 50 to 1,000 microns. According to the '964 and '211 patents, the diameter of the ring detector 28 is slightly larger than the diameter of the final pressure limiting aperture 14 and is placed immediately below and separated therefrom.

When the primary beam 12 strikes the specimen 24, as in FIG. 1, secondary electrons 35 and backscattered electrons, such as 37, 38 and 39, are released from the sample. For purposes of illustration, in the prior ESEM of FIG. 1, the '964 and '211 patents discussed that a bias voltage was to be applied to ring electrode 28 of approximately +500 V. The bullet detector 30 which forms the final pressure limiting aperture 14 is unbiased. In this configuration, high positive voltage on the ring electrode 28 causes the secondary electrons 35 emanating from the surface of the sample to be accelerated until they strike gas molecules of the gaseous environment in the specimen chamber 26. Multiple collisions with the gaseous environment cause other electrons to be released which are, as well, accelerated towards the ring electrode 28. Some examples of signal-gas interactions which are described in U.S. Pat. No. 4,992,662 to Danilatos and specifically incorporated herein are: gaseous scintillation, ionization, chemical combination, chemical disassociation, electron attachment, photo-ionization, X-ray reactions, rotational and vibrational collisions, collisions characterized by a particular energy loss, etc. According to the '964 and '211 patents, there will generally be many such collisions and eventually a cloud of hundreds or thousands of electrons will reach the ring electrode 28. The main objective, however, of the ring electrode 28 is to collect the electrons triggered by secondary electrons emanating from the specimen 24.

However, as illustrated in FIG. 1, secondary electrons are also generated by gas collisions from other sources; namely:

(a) collisions between the primary beam 12 and the gaseous environment of the specimen chamber, these secondary electrons being represented by reference numeral 43 in FIG. 1;

(b) collisions between the backscattered electrons 37 that pass through the pressure limiting aperture 14 and the gaseous environment of the specimen chamber 22, these secondary electrons being represented by reference numeral 45;

(c) collisions between the backscattered electrons 38 which pass through the gaseous environment between the sample 24 and the remainder of the specimen chamber, these secondary electrons being represented by reference numeral 47; and (d) backscattered electrons 39 which strike the pressure limiting aperture 14, and generate secondary electrons which are referred to by reference numeral 49.

All of the secondary electrons generated by these collisions are amplified by gas multiplication in the gaseous environment of the specimen chamber and add to the desired secondary electron signal. However, the secondary electrons that derive from the backscattered electrons, such as 43, 45, 47 and 49, add an undesired backscattered component to the secondary electron image being received by the ring detector 28. Furthermore, the secondary electrons 43 created by collisions between the primary beam 12 and the gaseous environment of the specimen chamber cause an undesired background noise component.

Thus, in order to enhance its signal capabilities, the environmental scanning electron microscope disclosed in U.S. Pat. Nos. 5,362,964 and 5,412,211 incorporated an improved secondary electron detector which reduced the backscattered electron component of the signal, such as signals 43, 45, 47 and 49 present in the FIG. 1 example, and reduced the signal noise produced by the primary beam, such as signal 43. In the embodiment of the environmental scanning electron microscope of U.S. Pat. Nos. 5,362,964 and 5,412,211 shown in FIG. 2, the ring electrode 28 is biased at an electrical potential between approximately 200 and 2,000 volts, and preferably 500 volts. Additionally, a pressure limiting aperture electrode 50 is formed integrally with the bullet detector defining the final pressure limiting aperture and is biased at an electrical potential between 200 and 2,000 volts, and preferably 500 volts. In the ESEM of U.S. Pat. Nos. 5,362,964 and 5,412,211, the ring electrode 28 and the pressure limiting aperture electrode 50 are preferably biased at the same electrical potential.

Figure 2:
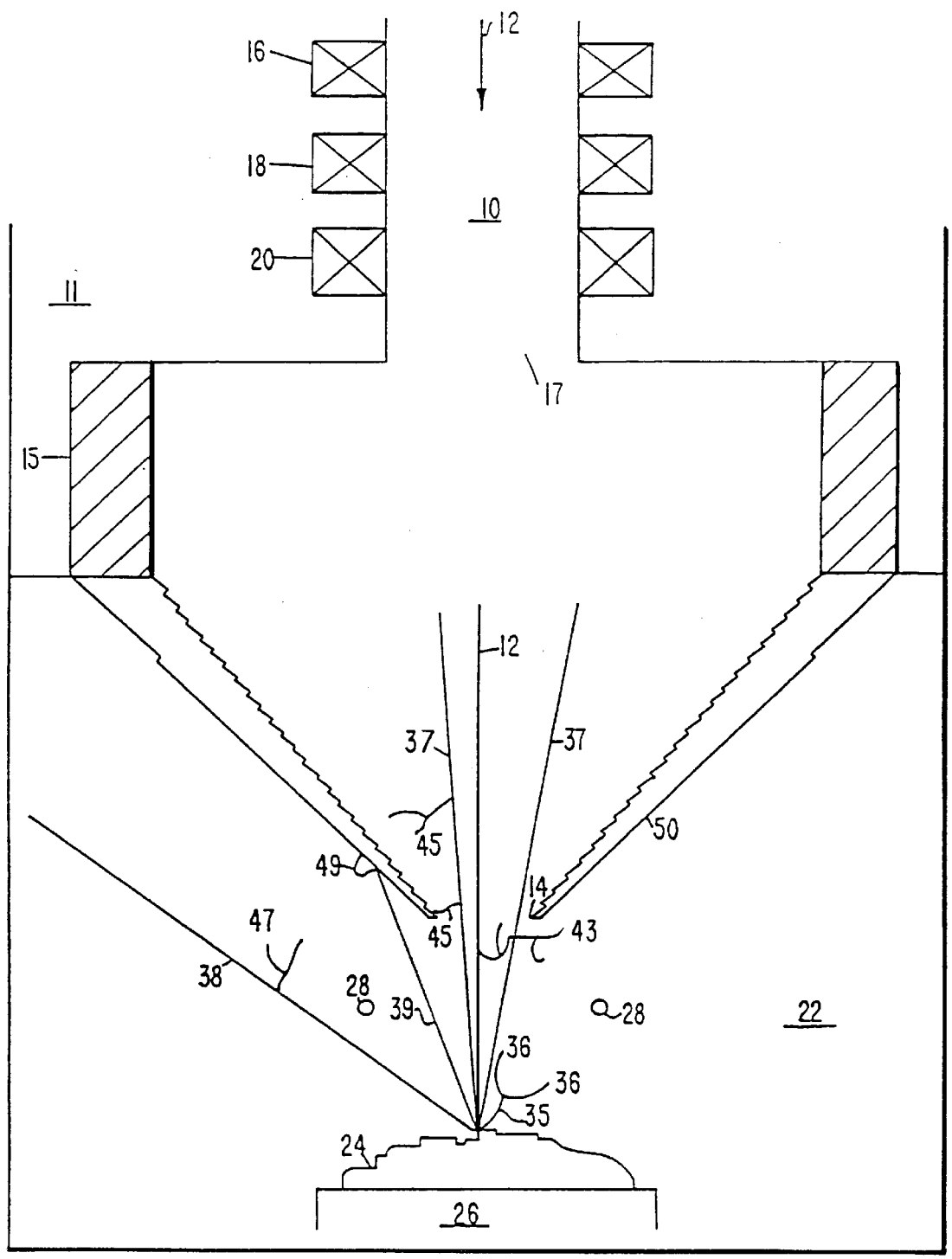
FIG. 2 is a schematic representation of one preferred embodiment of the environmental scanning electron microscope of U.S. Pat. Nos. 5,362,964 and 5,412,211 illustrating the preferred electron path trajectory.

As an example of the effect of the ESEM design of FIG. 2, if the ring electrode 28 and the final pressure limiting aperture electrode 50 are both biased at 500 volts, the desired secondary electrons 35 are accelerated and multiplied in the gaseous environment of the specimen chamber 22 to generate further secondary electrons 36 which are still collected by the ring electrode 28. However, in this configuration, most of the undesired secondary electrons are intercepted by the final pressure limiting aperture electrode 50. More specifically, the secondary electrons 45 generated by collisions with the backscattered electrons 37 are attracted to the positive surface of the pressure limiting aperture electrode 50. Further, many of the secondary electrons 43 generated by collisions between the primary beam 12 and the gaseous environment of the specimen chamber 22 are also attracted to the pressure limiting aperture electrode 50. In addition, the secondary electrons 49 generated by collisions between a backscattered electron 39 and the pressure limiting aperture 50 will no longer be accelerated away from the pressure limiting aperture and no gas amplification occurs. Accordingly, most of the undesirable signal components are not collected by the ring electrode 28, and therefore, the image signal derived from the ring electrode 28 is a more pure secondary electron image having a lower noise level.

Thus, this design of an environmental scanning electron microscope disclosed in U.S. Pat. Nos. 5,362,964 and 5,412,211 provided for imaging resolution capabilities of the specimen of about 4nm. In accordance with a general object of the present invention, as is set forth below, the environmental scanning electron microscope described in this application is an improvement to the environmental scanning electron microscope of U.S. Pat. Nos. 5,362,964 and 5,412,211 and achieves a spatial resolution of about 2nm, which is comparable to the spatial resolution of high vacuum field emission scanning electron microscopes.

In accordance therewith, this invention combines a field emission gun with an environmental scanning electron microscope to achieve substantially the same spatial resolution of the specimen maintained at a pressure of approximately 10 Torr that is achieved in the high vacuum scanning electron microscope, and that the ultra high vacuum required for the field emission gun can be maintained with 10 Torr gas pressure in the sample chamber.

As is described in more detail below, the environmental scanning electron microscope with field emission gun of the present invention includes:

(a) a number of differential pumping zones to provide the required vacuum in the field emission gun;

(b) an improved pressure limiting aperture assembly;

(c) an improved gaseous secondary electron detector; and (d) an improved resolution capability of 2nm.

Figure 3:
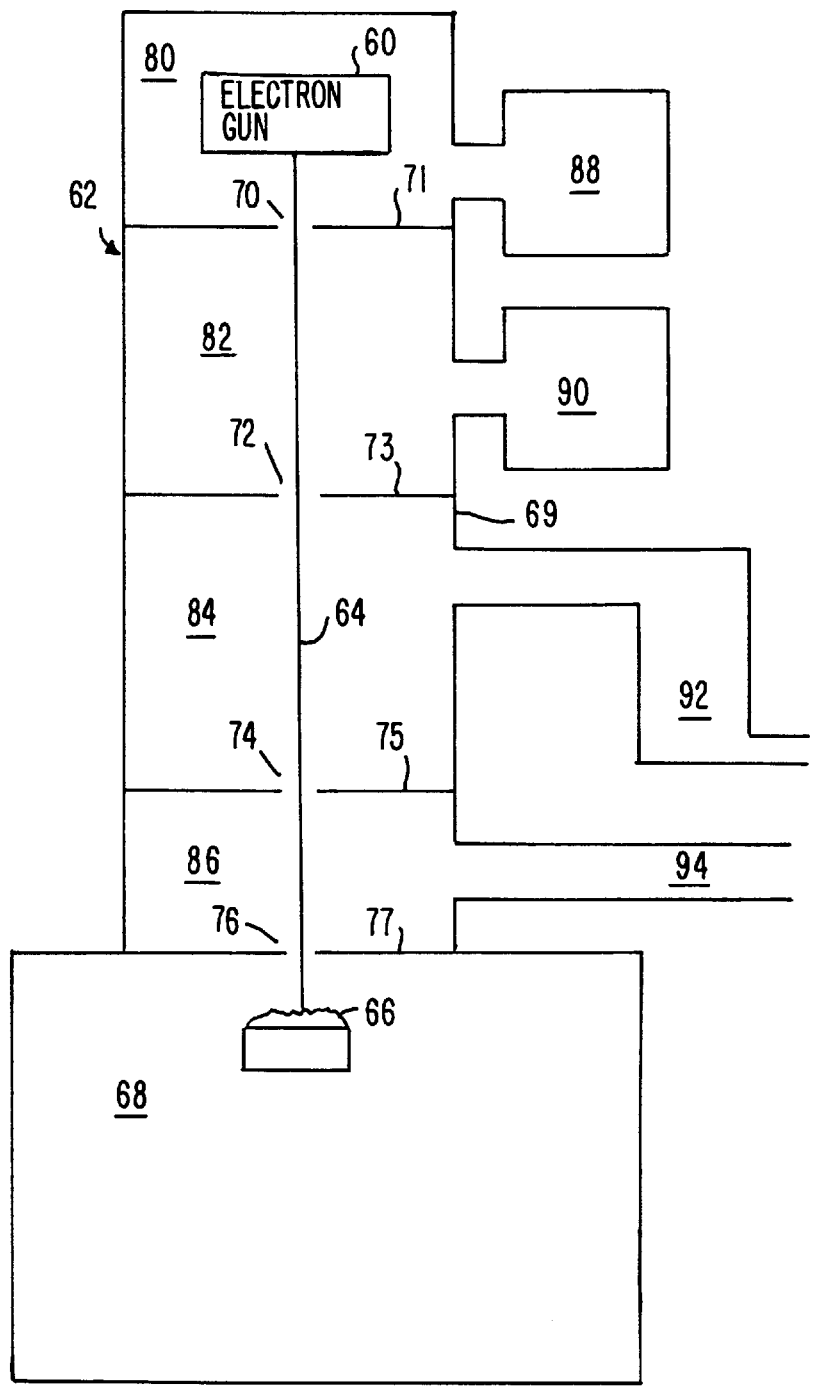
FIG. 3 is a schematic representation of a preferred embodiment of an environmental scanning electron microscope in accordance with the teachings of the present invention.

A preferred embodiment of the environmental scanning electron microscope which is capable of achieving an improved resolution capability of 2nm is illustrated in FIG. 3. The construction of the environmental scanning electron microscope of the present invention is similar to the construction of the environmental scanning electron microscope illustrated in FIGS. 1 and 2 of this application and disclosed in U.S. Pat. No. 5,362,964 and 5,412,211, except for the additional features set forth herein. This environmental scanning electron microscope includes a field emission electron gun 60 and an electron optical column 62 to direct the electron beam 64 toward the sample 66. The sample is contained in the gaseous environment of the sample chamber 68 which can be maintained at any pressure between $10^{-2}$ Torr and 50 Torr, but preferably up to at least 10 Torr. As is shown in FIG. 3, the path of the electron beam 64 is through the electron optic column 62 which includes a differentially pumped aperture system 69 including four or more pressure limiting apertures: an upper pressure limiting aperture 70, a first intermediate pressure limiting aperture 72, a second limiting pressure limiting aperture 74, and the final pressure limiting aperture 76. Each of the pressure limiting apertures 70, 72, 74 and 76 is provided in a central opening of a respective vacuum wall 71, 73, 75, 77. The pressure limiting apertures 70, 72, 74 and 76 divide the microscope into five vacuum zones: namely; a high vacuum zone 80, a first intermediate vacuum zone 82, a second intermediate vacuum zone 84, a third intermediate vacuum zone 86 and the sample chamber 68. These pressure limiting apertures 70, 72, 74 and 76 restrict the flow of gas from one zone to another.

Each zone is maintained at a different pressure to provide a series of pressure gradients through which the electron beam passes and to thereby provide a pressure difference up to $10^{10}$ Torr between the operating pressure of the field emission gun and the specimen chamber. In the preferred embodiment, the high vacuum zone 80 is maintained at a pressure of approximately $10^{-10}$ Torr. The first intermediate vacuum zone 82 is maintained at a pressure of approximately $10^{-7}$ Torr. The second intermediate vacuum zone 84 is maintained at a pressure of approximately $10^{-4}$ Torr. The third intermediate vacuum zone 86 is maintained at a pressure of approximately 0.1 Torr. Lastly, the specimen chamber 68 is maintained, as aforementioned, at a pressure of approximately 10 Torr.

The differentially pumped aperture system 69 of the electron optic column 62 of the ESEM includes a pumping system to collect gas that flows through the pressure limiting apertures. In order to achieve that result, each of the vacuum zones 70, 72, 74 and 76 is connected to a vacuum pump. More specifically, in the preferred embodiment, ion pumps 88 and 90 are respectively connected to the high vacuum zone 80 and the first intermediate vacuum zone 82. A diffusion pump 92 is connected to the second intermediate vacuum zone 84 and a rotary pump 94 is connected to the third intermediate vacuum zone 86. Other types of vacuum pumps can be used. For example, the rotary pump 94 can be replaced with a dry pump and the diffusion pump 92 can be replaced by a turbomolecular pump.

As a result of the design of an ESEM shown in FIG. 3 which utilizes a field emission gun, spatial resolution capabilities of the specimen of 2nm are achieved even though the specimen is contained in the gaseous environment of the specimen chamber.

The environmental scanning electron microscope with field emission gun of the present invention can not only be used to detect secondary electrons, but also can be used to detect other types of signal-gas interactions such as gaseous scintillation, ionization, chemical combination, chemical disassociation, electron attachment, photo-ionization, X-ray reactions, rotational and vibrational collisions, collisions characterized by a particular energy loss, etc. Moreover, the use of the field emission gun of this ESEM can be employed with any gas in the specimen chamber.

Figure 6:
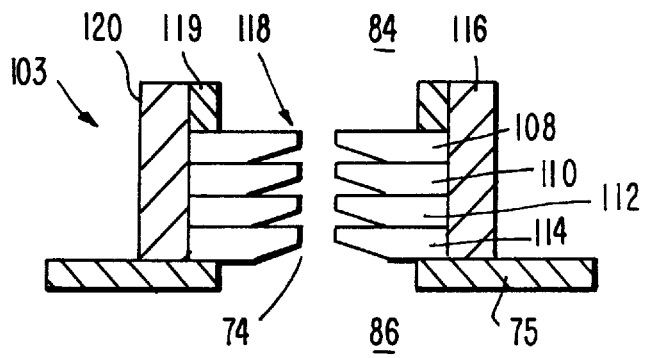
FIG. 6 is a schematic representation of an improved pressure limiting aperture assembly to be used in conjunction with the environmental scanning electron microscope of the present invention illustrated in FIG. 3.

Another object of the environmental scanning electron microscope of the present invention is the design of the second intermediate pressure limiting aperture, designated as 74 in FIG. 6. This aperture is integrally mounted on an electron lens (not shown) that focuses the electron beam 64 on the sample. It is well known that an aperture in this position must be free of contamination in order that the beam be accurately focused.

Figure 4:
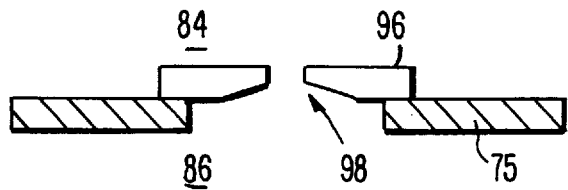
FIG. 4 is a schematic representation of a prior pressure limiting aperture assembly which has been employed in conventional scanning electron microscopes.

In order to keep such a pressure limiting aperture free of contamination, it is very common in conventional scanning electron microscopes to utilize a platinum aperture in this position. As shown in FIG. 4, in scanning electron microscopes, a single platinum aperture 96 can be employed as the pressure limiting aperture which extends within the central opening 98 of the annular diaphragm provided between the second and third intermediate vacuum zones. In order to remove any contamination that would affect the beam this platinum aperture 96 can be heated to high temperatures (without damage).

Figure 5:
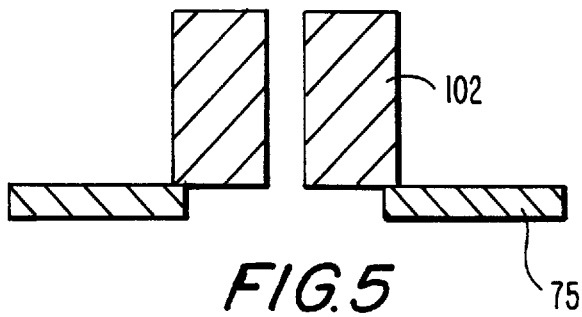
FIG. 5 is a schematic representation of a prior tube assembly utilized to restrict gas flow in a conventional scanning electron microscope.

However, the second intermediate pressure limiting aperture 74 in this environmental scanning electron microscope has to provide a relatively large restriction on the gas flow as well. A single aperture, such as in the prior platinum aperture design of FIG. 4, is not typically sufficient to provide this restriction. In conventional vacuum technology, as is shown in FIG. 5, an extended tube 102 would be used to provide this restriction. However, it has been found difficult to insure that the inside of this tube employed in conventional vacuum technology can be readily cleaned.

Therefore, as is shown in FIG. 6, the environmental scanning electron microscope of the present invention includes a pressure limiting aperture assembly 103 for the second intermediate pressure limiting aperture 74 which is not only designed to be free of contamination, but is also easily cleaned. Thus, the pressure limiting aperture assembly 103 replaces the conventionally employed tube, such as 102 in FIG. 4, with a plurality of stacked generally annular platinum apertures, such as 108, 110, 112, and 114. In contrast to the conventional aperture assemblies of FIGS. 4 and 5, the aperture assembly of FIG. 6 provides the required gas flow restriction for the second pressure limiting aperture 74 of the ESEM employing a field emission gun of FIG. 3. As is shown in FIG. 6, an aperture holder 116 is sealed to the annular vacuum wall 75 between the second and third intermediate vacuum zones 84 and 86. More particularly, the plurality of stacked annular platinum apertures 108, 110, 112 and 114 are fitted into the aperture holder 116 which extends upwardly from the annular vacuum wall 75. The platinum apertures 108, 110, 112 and 114 extend inwardly from the aperture holder 118 so that the only gas path is through the opening 116 provided in each of the platinum apertures. As is shown in FIG. 6, an annular retaining ring 119 is positioned inwardly of the top portion 120 of the aperture holder 116 and thereby compresses the platinum apertures 108, 110, 112 and 114 tightly together between the retaining ring 119 and annular vacuum wall 75.

As aforementioned, the combination of the plurality of stacked annular platinum apertures 108, 110, 112 and 114 provides the required gas restriction. Although four apertures are preferably illustrated in FIG. 6, the number of platinum apertures employed can be preselected to provide for the required gas restriction. Moreover, materials other than platinum can be employed, and in addition, the aperture can be maintained at a high temperature to prevent contamination from forming.

A further object of this invention is to provide an improved gaseous electron detector to be utilized in this environmental scanning electron microscope employing a field emission gun to the gaseous electron detector shown in FIG. 20 of U.S. Pat. No. 5,412,211 which is represented in FIG. 7 of this application.

In FIG. 7, an environmental scanning electron microscope employing printed circuit board technology is shown. In this prior ESEM, a printed circuit board 132 is positioned in the specimen chamber in a generally horizontal manner. The detector body 172 is mounted to the electron optic column and provides a path of the electron beam to pass therethrough. This detector body 172 is described in U.S. Pat. No. 412,211 as being similar to the aperture carrier described in U.S. Pat. No. 4,823,006 assigned to the common assignee of this application except that the detector head in FIG. 7 forms the lower portion of the detector body. As is shown in FIG. 7, this detector body 172 is threaded into the vacuum wall 174 which corresponds to vacuum wall 77 in FIG. 3. In this configuration, a signal collection ring electrode 136 extends downwardly from the printed circuit board 132 and the final pressure limiting aperture 144 integrally formed in the printed circuit board by means of support legs, such 140a and 140b, and faces the specimen 178 under examination. As a result thereof, U.S. Pat. No. 5,412,211 describes that the primary beam 176 passes through the final pressure limiting aperture 144 and impinges upon the specimen 178. Secondary electrons emitted from the surface of the specimen are thus collected by the suitably biased signal ring electrode 136.

As is shown in the prior gaseous electron detector of FIG. 7, the insulating surface of the printed circuit board is "hidden" to avoid disturbing the primary electron beam. A copper ring 171 is thus provided on the top surface of the printed circuit board which is of a sufficient width such that it extends outwardly of the final pressure limiting aperture 144 to an extent that the primary beam will never strike an insulating surface of the printed circuit board.

In an environmental scanning electron microscope utilizing a field emission gun of the present invention, the electron beam diameter is approximately one-half the diameter of that previously achieved in an environmental scanning electron microscope. Therefore, an improved gaseous electron detector has been designed in comparison to the prior gaseous electron detector of FIG. 7 to minimize beam loss during the path of the electron beam through the gas between the detector and the sample. This beam loss can be reduced by shortening the electron beam path length by positioning the sample very close to the detector. However, the performance of the electron detector is typically reduced at shortened gas paths.

Accordingly, as is illustrated in FIG. 8, the improved gaseous electron detector of the present invention allows a short electron beam path to the sample through the gaseous environment of specimen chamber, but maintains a relatively long gas path to the detector. In the improved detector of FIG. 8, the final pressure limiting aperture 144 of the printed circuit board 132 angularly extends inwardly in an inverted conical arrangement through the collection ring electrode 136 of the printed circuit board 132. This reduces the length of the path of the electron beam through the chamber gas represented by the distance a in FIG. 8. However, the path from the sample 178 to the signal ring electrode 136 represented by the distance b is still sufficiently long enough to obtain satisfactory detection performance.

Figure 9:
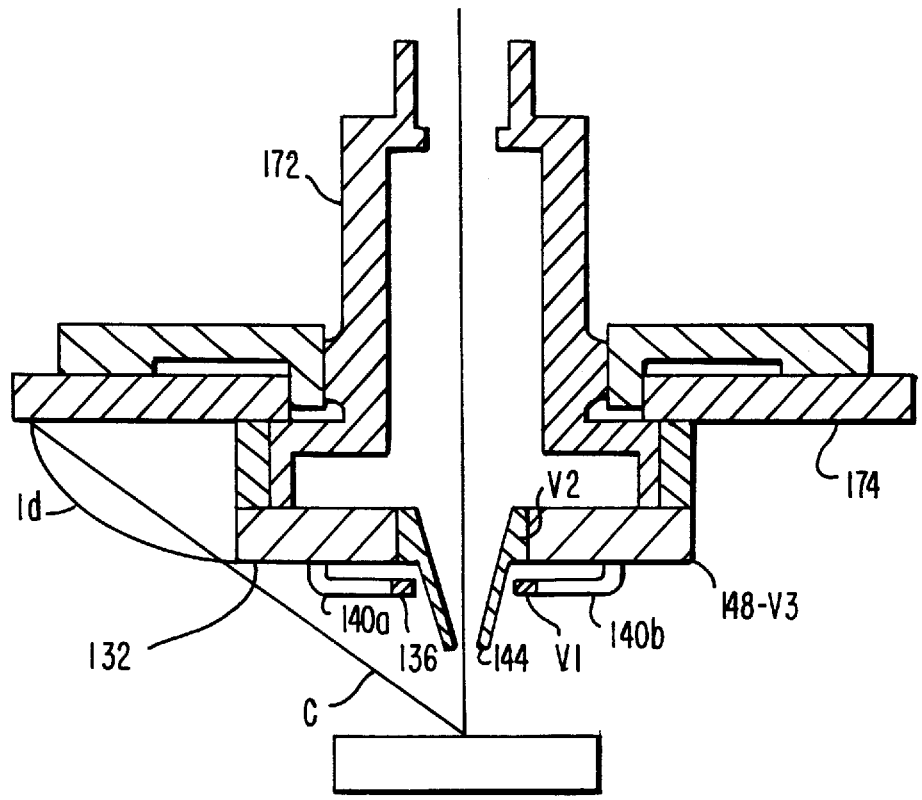
FIG. 9 is another preferred embodiment of an improved gaseous electron detector assembly to be used in conjunction with the environmental scanning electron microscope of the present invention illustrated in FIG. 3.

Another improvement of the environmental scanning electron microscope of the present invention is shown in FIG. 9. In the gaseous detector of U.S. Pat. No. 5,412,211 illustrated in FIG. 7, the final pressure limiting aperture 144 is connected to a bias voltage that is identical to the bias voltage applied to the signal collection detector ring 136. In the improved detector of FIGS. 8 and 9, a different bias is applied to the final pressure limiting aperture 144 and also to the surface of the printed circuit board 132 that supports the final pressure limiting aperture and the signal collection detection ring 136.

Preferably, the detector ring 136 is biased at a voltage (V1) necessary for satisfactory detection, typically about +500 volts. The final pressure limiting aperture 144 is biased at a lower voltage (V2) (about 5 to 100 volts less than V1). This lower voltage ensures that the electron signal generated in the gas is not collected by the pressure limiting aperture 144, but is deflected to the detector ring 136.

A further improvement is that the printed circuit board 132 includes a guard ring 148 being placed outside of the detector ring 136. The guard ring 148 is biased at a separate voltage V3. This voltage is set so that the guard ring 148 collects the secondary electrons produced by backscattered electrons, designated by path c, which strike the objective lens 174 as represented by the path d. The guard ring 148 is normally biased such that V3=V2 but may be set at a different voltage depending upon the detection requirements.

The main intention of the guard ring 148 is to stop the backscattered electron signal from the pole piece being collected by the detector ring. It is thus envisioned that the signal collected by the guard ring 148 can be used to provide a backscattered electron image.

Accordingly, an environmental scanning electron microscope employing a field emission gun has been designed which can provide for a spatial resolution of the specimen of 2nm even though the specimen is maintained at a pressure $10^{-2}$ Torr to 50 Torr in the gaseous environment of this specimen chamber. In addition, an environmental scanning electron microscope has been designed which achieves improved spatial resolution by using a field emission gun which can be used at any voltage to high beam voltages such as high beam voltages of 300–500 kv. Further, this environmental scanning electron microscope with field emission gun achieves an improved spatial resolution capability of 2nm which is a comparable spatial resolution to that achieved in high vacuum field emission scanning electron microscopes.

Although the invention has been particularly shown and described with reference to certain preferred embodiments, it will be readily appreciated by those of ordinary skill in the art that various changes and modifications may be made therein without departing from the spirit and scope of the invention. It is intended that the appended claims be interpreted as including the foregoing as well as various other such changes and modifications.

What is claimed is:

1. An environmental scanning electron microscope which provides for improved spatial resolution of a specimen under examination of approximately 2nm, said environmental scanning electron microscope comprising:

(a) means for generating and directing an electron beam toward the specimen wherein said generation means is a field emission gun;

(b) an electron optic column comprising a differentially pumped aperture system including at least four differentially pumped vacuum zones to provide a pressure difference up to approximately $10^{10}$ Torr between said field emission gun and said specimen, said differentially pumped aperture system further including at least four pressure limiting apertures to define said at least four differentially pumped vacuum zones through which the electron beam passes;

(c) a specimen chamber which maintains the specimen enveloped in gas in registration with a final pressure limiting aperture of said at least four pressure limiting apertures of said differentially pumped aperture system; and (d) means for detecting signals emanating from the surface of the specimen.

2. The environmental scanning electron microscope of claim 1 wherein said at least four differentially pumped vacuum zones through which said electron beam passes include a high vacuum zone of said field emission gun maintained at a pressure of approximately $10^{-10}$ Torr, a first intermediate vacuum zone maintained at a pressure of approximately $10^{-7}$ Torr, a second intermediate vacuum zone maintained at a pressure of approximately $10^{-4}$ Torr, a third intermediate vacuum zone maintained at a pressure of approximately 0.1 Torr, and said specimen chamber is maintained at a pressure of approximately 10 Torr.

3. The environmental scanning electron microscope of claim 2 wherein said at least four pressure limiting apertures of said electron optic column include an upper pressure limiting aperture provided between the high vacuum zone and the first intermediate vacuum zone, a first intermediate pressure limiting aperture provided between said first and second intermediate vacuum zones, a second intermediate pressure limiting aperture provided between said second and third intermediate vacuum zones, and a final pressure limiting aperture provided between said third intermediate vacuum zone and said specimen chamber.

4. The environmental scanning electron microscope of claim 3 wherein said second intermediate pressure limiting aperture is formed of a pressure limiting aperture assembly having a plurality of stacked generally annular apertures.

5. The environmental scanning electron microscope of claim 4 wherein said plurality of annular apertures are formed of platinum and are fitted into an aperture holder which is sealed to and extends upwardly from an annular vacuum wall between said second and third intermediate vacuum zones.

6. The environmental scanning electron microscope of claim 5 wherein said pressure limiting aperture assembly of said second intermediate pressure limiting aperture includes an annular retaining ring which is positioned inwardly from a top portion of said aperture holder to compress said plurality of annular apertures tightly together between said retainer ring and said annular vacuum wall.

7. The environmental scanning electron microscope of claim 4 wherein said pressure limiting aperture assembly includes at least four annular apertures.

8. The environmental scanning electron microscope of claim 1 wherein said detecting means comprises a printed circuit board including a detector head having collection electrode means thereon for collecting signals emanating from a the specimen under examination.

9. The environmental scanning electron microscope of claim 8 wherein said detector head includes a signal ring electrode biased to collect secondary electrons emanating from the surface of the specimen.

10. The environmental scanning electron microscope of claim 9 wherein said printed circuit board includes the final pressure limiting aperture which extends annularly through said signal ring electrode to thereby reduce the path length of the electron beam through the gas in the specimen chamber.

11. The environmental scanning electron microscope of claim 10 wherein said detector ring is biased at a voltage V1 of approximately +500 volts and said final pressure limiting aperture is biased at a voltage V2 approximately 5 to 100 volts less than V1.

12. The environmental scanning electron microscope of claim 11 wherein said printed circuit board includes a guard ring positioned outwardly of said signal ring electrode, said guard ring being biased at a voltage V3 which is preset so that said guard ring collects secondary electrons produced by backscattered electrons which strike the objective lens assembly.

13. The environmental scanning electron microscope of claim 12 wherein said guard ring is biased at approximately the same electrical potential as said final pressure limiting aperture.

14. The environmental scanning electron microscope of claim 1 wherein said field emission gun can be used at high beam voltages of approximately 300–500kv.

15. The environmental scanning electron microscope of claim 1 wherein said specimen is maintained at a pressure of approximately $10^{-2}$ Torr to 50 Torr in the gaseous environment of the specimen chamber and a spatial resolution of the specimen of approximately 2nm is achieved.

16. An environmental scanning electron microscope which provides for improved spatial resolution of a specimen under examination, said environmental scanning electron microscope comprising:
   a) means for generating and directing an electron beam toward the specimen wherein said generation means is a field emission gun;
   b) an electron optic column having a differentially pumped aperture system including at least four differentially pumped vacuum zones to provide a predetermined pressure difference between said field emission gun and said specimen, said differentially pumped aperture system further including at least four pressure limiting apertures to define said at least four differentially pumped vacuum zones through which the electron beam passes wherein one of said pressure limiting apertures comprises a pressure limiting aperture assembly being formed of a plurality of stacked generally annular apertures;
   c) a specimen chamber which maintains the specimen enveloped in gas in registration with a final pressure limiting aperture of said at least four pressure limiting apertures of said differentially pumped aperture system; and
   d) means for detecting signals emanating from the surface of the specimen.

17. The environmental scanning electron microscope of claim 16 wherein said at least four differentially pumped vacuum zones through which said electron beam passes include a high vacuum zone of said field emission gun maintained at a pressure of approximately $10^{-10}$ Torr, a first intermediate vacuum zone maintained at a pressure of approximately $10^{-7}$ Torr, a second intermediate vacuum zone maintained at a pressure of approximately $10^{-4}$ Torr, a third intermediate vacuum of approximately 0.1 Torr, and said specimen chamber is maintained at a pressure of approximately 10 Torr.

18. The environmental scanning electron microscope of claim 17 wherein said at least four pressure limiting apertures of said objective lens assembly include an upper pressure limiting aperture provided between the high vacuum zone and the first intermediate vacuum zone, a first intermediate pressure limiting aperture provided between said first and second intermediate vacuum zones, a second intermediate pressure limiting aperture provided between said second and third vacuum zones, and a final pressure limiting aperture provided between said third intermediate vacuum zone and said specimen chamber.

19. The environmental scanning electron microscope of claim 18 wherein said second intermediate pressure limiting aperture is formed of said pressure limiting aperture assembly including said plurality of stacked annular apertures which are formed of platinum.

20. The environmental scanning electron microscope of claim 19 wherein said pressure limiting aperture assembly further includes an aperture holder which is sealed to an annular vacuum wall between said second and third intermediate vacuums zones.

21. The environmental scanning electron microscope of claim 20 wherein said plurality of annular apertures are fitted into said aperture holder which extends upwardly from said annular vacuum wall.

22. The environmental scanning electron microscope of claim 21 wherein an annular retaining ring is positioned inwardly of a top portion of said aperture holder to thereby compress said plurality of annular apertures tightly together between said retaining ring and said annular vacuum wall.

23. The environmental scanning electron microscope of claim 21 wherein said pressure limiting aperture assembly includes at least four annular apertures.

24. The environmental scanning electron microscope of claim 18 wherein said detecting means comprises a printed circuit board including a detector head having collection electrode means thereon for collecting signals emanating from the specimen under examination, said detector head including a signal ring electrode biased to collect secondary electron emanating from the surface of the specimen.

25. The environmental scanning electron microscope of claim 24 wherein said printed circuit board includes said final pressure limiting aperture which extends annularly through said signal ring electrode such that the length of the electron beam through the gas of the specimen chamber is minimized.

26. The environmental scanning electron microscope of claim 25 wherein said signal ring electrode is biased at a voltage V1 of approximately +500 volts and said final pressure limiting aperture is biased at a voltage V2 which is approximately 5 to 100 volts less than the voltage V1 applied to said signal ring electrode.

27. The environmental scanning electron microscope of claim 26 wherein said printed circuit board includes a guard ring positioned outwardly of said signal ring electrode, said guard ring being biased at a voltage V3 which is preset so that said guard ring collects secondary electrons produced by backscattered electrons which strike the objective lens assembly.

28. The environmental scanning electron microscope of claim 27 wherein said guard ring is biased at a voltage V3 which is approximately equal to the voltage V1 applied to said signal ring electrode.

29. An environmental scanning electron microscope of which provides for improved spatial resolution of a specimen under examination, said environmental scanning electron microscope comprising:

(a) means for generating and directing an electron beam toward the specimen wherein said generation means is a field emission gun;

(b) an electron optic column having a differentially pumped aperture system including at least four differentially pumped vacuum zones to provide a predetermined pressure difference between said field emission gun and said specimen, said differentially pumped aperture system further including at least four pressure limiting apertures to define said at least four differentially pumped vacuum zones through which the electron beam passes;

(c) a specimen chamber which maintains the specimen enveloped in gas in registration with a final pressure limiting aperture of said at least four pressure limiting apertures of said differentially pumped aperture system; and (d) means for detecting signals emanating from the surface of the specimen wherein said detecting means comprises a printed circuit board including a detector head having collection electrode means thereon for collecting signals emanating from a specimen under examination, said detector head including a signal ring electrode biased to collect secondary electrons emanating from the surface of the specimen, and said printed circuit board further including said final pressure limiting aperture which extends annularly through said signal ring electrode such that the electron beam path through the gas between said final pressure limiting aperture and said specimen is minimized.

30. The environmental scanning electron microscope of claim 29 wherein said signal ring electrode is biased at a voltage V1 of approximately +500 volts and said final pressure limiting aperture is biased at a voltage V2 approximately 5 to 100 volts less than the voltage applied to said signal ring electrode V1.

31. The environmental scanning electron microscope of claim 30 wherein said printed circuit board includes a guard ring positioned outwardly of said signal ring electrode, said guard ring being biased at a voltage V3 which is preset so that said guard ring collects secondary electrons produced by backscattered electrons which strike said objective lens assembly wherein said guard ring beam is biased at a voltage V3 which is approximately equal to the voltage of said signal ring electrode V1.

32. The environmental scanning electron microscope of claim 29 wherein said at least four differentially pumped vacuum zones through which said electrode beam passes include a high vacuum zone of said field emission gun maintained at a pressure of approximately 10–10 Torr, a first intermediate vacuum zone maintained at a pressure of approximately 10–7 Torr, a second intermediate vacuum zone maintained at a pressure of approximately 10–4 Torr, a third intermediate vacuum zone maintained at a pressure of approximately 0.1 Torr, and said specimen chamber is maintained at a pressure of approximately 10 Torr.

33. The environmental scanning electron microscope of claim 32 wherein said at least four pressure limiting apertures of said differentially pumped aperture system include an upper pressure limiting aperture provided between said high vacuum zone and said first intermediate vacuum zone, a first intermediate pressure limiting aperture provided between said first and second intermediate vacuum zones, a second intermediate pressure limiting aperture provided between said second and third intermediate vacuum zones, and said final pressure limiting aperture being provided between said third intermediate vacuum zone and said specimen chamber.

34. The environmental scanning electron microscope of claim 33 wherein said second intermediate pressure limiting aperture comprises a pressure limiting aperture assembly which includes a plurality of stacked annular apertures fitted into an aperture holder which is sealed to and extends upwardly from an annular vacuum wall between said second and third intermediate vacuum zones.

35. The environmental scanning electron microscope of claim 34 wherein an annular retaining ring is positioned inwardly from a top portion of said aperture holder to thereby compress said plurality of annular apertures tightly together between said retaining ring and said annular vacuum wall.

36. An environmental scanning electron microscope of which provides for improved spatial resolution of a specimen under examination, said environmental scanning electron microscope comprising:

(a) means for generating and directing an electron beam toward the specimen wherein said generation means is a field emission gun;

(b) an objective lens assembly comprising a differentially pumped aperture system including at least four differentially pumped vacuum zones to provide a pressure difference up to approximately $10^{10}$ Torr between said field emission gun and said specimen, said differentially pumped aperture system further including at least four pressure limiting apertures to define said at least four differentially pumped vacuum zones through which the electron beam passes, said at least four differentially pumped vacuum zones including a high vacuum zone of said field emission gun maintained at a pressure of approximately $10^{-10}$ Torr, a first intermediate vacuum zone maintained at a pressure of approximately $10^{-7}$ Torr, a second intermediate vacuum zone maintained at a pressure of approximately $10^{-4}$ Torr, and a third intermediate vacuum zone maintained at a pressure of approximately 0.1 Torr, said at least four pressure limiting apertures of said differentially pumped aperture system include an upper pressure limiting aperture provided between said high vacuum zone and said first intermediate vacuum zone, a first intermediate pressure limiting aperture provided between said first and second intermediate vacuum zones, a second intermediate pressure limiting aperture provided between said second and third intermediate vacuum zones, and a final pressure limiting aperture provided between said third intermediate vacuum zone and a specimen chamber which maintains the specimen enveloped in gas in registration with the pressure limiting apertures and which is maintained at a pressure of approximately 10 Torr, said second intermediate pressure limiting aperture including a pressure limiting aperture assembly having a plurality of stacked annular platinum apertures which are fitted into an aperture holder which is sealed to and extends upwardly from an annular vacuum wall between said second and third intermediate vacuum zones; and (d) means for detecting signals emanating from the surface of the specimen wherein said detecting means comprises a printed circuit board including a detector head having collection electrode means thereon for collecting signals emanating from a specimen to be examined, said detector head including a signal ring electrode biased to collect secondary electrons emanating from the surface of the specimen, and wherein said printed circuit board includes said final pressure limiting aperture which extends through said signal ring electrode to thereby reduce the length of the path of the electron beam through the gas of the specimen chamber.

37. A electron detector for an environmental scanning electron microscope comprising a printed circuit board including a detector head having collection electrode means thereon for collecting signals emanating from a specimen to be examined with said detector head including a signal ring electrode biased to collect secondary electrons emanating from the surface of the specimen, and said printed circuit board further including a final pressure limiting aperture integrally formed therewith which extends through said signal ring electrode.

* * * * *

UNITED STATES PATENT AND TRADEMARK OFFICE
CERTIFICATE OF CORRECTION

PATENT NO. : 5,828,064
DATED : October 27, 1998
INVENTOR(S) : W. Ralph Knowles

It is certified that error appears in the above-identified patent and that said Letters Patent is hereby corrected as shown below:

In claim 32, column 16, line 25, change "10-10" to --$10^{-10}$--;

line 27, change "10-7" to --$10^{-7}$--; and line 28, change "10-4" to --$10^{-4}$--.

Signed and Sealed this

Thirtieth Day of March, 1999

Attest:

Q. TODD DICKINSON

Attesting Officer    Acting Commissioner of Patents and Trademarks